United States Patent
Qin

(10) Patent No.: US 7,235,493 B2
(45) Date of Patent: Jun. 26, 2007

(54) LOW-K DIELECTRIC PROCESS FOR MULTILEVEL INTERCONNECTION USING MIRCOCAVITY ENGINEERING DURING ELECTRIC CIRCUIT MANUFACTURE

(75) Inventor: Shu Qin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 10/968,786

(22) Filed: Oct. 18, 2004

(65) Prior Publication Data

US 2006/0084262 A1 Apr. 20, 2006

(51) Int. Cl.
*H01L 21/311* (2006.01)

(52) U.S. Cl. .................. 438/739; 438/619; 438/622; 257/637

(58) Field of Classification Search .............. 438/739
See application file for complete search history.

(56) References Cited

U.S. PATENT DOCUMENTS

| | | | |
|---|---|---|---|
| 5,229,331 A | 7/1993 | Doan et al. .............. 438/20 |
| 5,994,776 A | 11/1999 | Fang et al. .............. 257/758 |
| 6,121,552 A | 9/2000 | Brosnihan et al. ......... 174/253 |
| 6,136,687 A | 10/2000 | Lee et al. ................ 438/624 |
| 6,165,890 A | 12/2000 | Kohl et al. ............... 438/619 |
| 6,177,329 B1 | 1/2001 | Pang ..................... 438/400 |
| 6,261,949 B1 * | 7/2001 | Sukekawa ............... 438/637 |
| 6,376,357 B1 | 4/2002 | Onuma .................. 438/619 |
| 6,406,992 B1 | 6/2002 | Mao et al. ............... 438/622 |
| 6,451,669 B2 | 9/2002 | Torres et al. ............. 438/409 |
| 6,589,861 B2 | 7/2003 | Park et al. ............... 438/619 |
| 6,627,529 B2 | 9/2003 | Ireland ................... 438/619 |

* cited by examiner

*Primary Examiner*—Carl Whitehead, Jr.
*Assistant Examiner*—Colleen E. Rodgers
(74) *Attorney, Agent, or Firm*—Kevin D. Martin

(57) ABSTRACT

One embodiment of a method for forming a low-k dielectric for a semiconductor device assembly comprises forming a silicon dioxide layer, then forming a patterned masking layer such as silicon nitride on the silicon dioxide. Using the patterned nitride layer as a pattern, the silicon dioxide is etched to form a plurality of hemispherical microcavities in the silicon dioxide. Openings in the patterned nitride are filled, then another layer is formed over the silicon nitride layer using the silicon nitride as a support over the microcavities. An inventive structure resulting from the method is also described.

22 Claims, 11 Drawing Sheets

LOW-K DIELECTRIC PROCESS FOR MULTILEVEL INTERCONNECTION USING MIRCOCAVITY ENGINEERING DURING ELECTRIC CIRCUIT MANUFACTURE

FIELD OF THE INVENTION

This invention relates to a method for fabricating a low-k interlayer dielectric for ultra large scale integration (ULSI) multilevel interconnections during the manufacture of an electronic circuit.

BACKGROUND OF THE INVENTION

Many structures are required during the manufacture of a semiconductor device, such as conductive plugs, transistors, capacitors, and conductive lines. A common design goal of semiconductor engineers is to decrease the size of these features to increase the number of features which can be formed in a given area. Decreasing feature size results in decreased production costs and, ultimately, miniaturized electronic devices into which the semiconductor device is installed.

Increasing electrical interference between adjacent features is a concern with decreasing device feature size. For example, as the width of conductive lines and the spacing between adjacent lines decreases, electrical crosstalk and resistance-capacitance (RC) delay increases. Copper interconnections with low-k interlayer dielectric (ILD) materials have been introduced for advanced integrated circuits (IC's) to reduce the RC delay of interconnections. Properties of ILD's and their fabrication techniques used with circuit miniaturization, for example using fine copper interconnects, must provide various properties such as a low dielectric constant (low-k) and electrical properties such as high bulk resistivity and breakdown field strength. They must also have good mechanical properties, such as resistance to separation from the copper interconnect during thermal changes and good chemical properties such as being chemically inert and stable. Further, they must accept planarization, have narrow gap filling capability, and have a low processing temperature to conserve the thermal budget.

One method currently used to form ILD's comprises doping silicon dioxide with fluorine which results in an $SiO_2F$ layer having a decreased dielectric constant. However, present processing technologies are not able to deliver high quality films of $SiO_2F$ for low-k ILD, and these films typically suffer from relatively high dielectric constants of about 3.6. Chemical vapor deposition (CVD) processes are limited by thermodynamic constraints and, consequently, the reduction in the dielectric constant is relatively small. It is difficult to reduce the dielectric constant of fluorinated $SiO_2$ films to below 3.5, because the electrical and mechanical properties of $SiO_2F$ dielectric films, such as bulk resistivity and breakdown field strength, are usually degraded. Also, there are reliability concerns with the addition of fluorine which result from chemical interaction of the fluorine with the metal interconnect which the $SiO_2F$ ILD contacts. Fluorine species in $SiO_2F$ films are not stable and easily absorb moisture to form OH and HF radicals. The existing OH will increase the dielectric constant of the ILD, and both HF and OH radicals can corrode dielectrics and metal layers.

To overcome the thermodynamic and reliability problems of $SiO_2F$ films formed using CVD, ion implantation, particularly multi-species implantation by plasma immersion ion implantation (PIII), can be used to fabricate fluorinated $SiO_2$ ILD's. However, PIII fluorinated $SiO_2$ films have a minimum dielectric constant of about 2.8. Further, this technique is relatively new and films formed using this process need to be more thoroughly investigated for stability.

Porous dielectric materials have also been developed to reduce the dielectric constant and overcome problems with prior films. Dielectric constants as low as about 2.6 have been claimed by these dielectrics. Various challenges are associated with this class of materials for use with integrated circuits. For example, most low-k porous dielectric processes involve the use of either organic or inorganic materials which require a relatively high temperature for the decomposition and chemical reaction which uses a significant portion of the thermal budget. These materials may also suffer from poor mechanical, chemical, and thermal stability due to their lower density and the porous structure itself, and thus the reliability of the porous films is questionable. With decreasing dielectric constants the stability and reliability of the porous film also decreases. A barrier layer may be required between a copper interconnect and a porous ILD layer to protect the dielectric from copper diffusion and from process gasses and other chemical penetrations. A thin film which is formed on a porous ILD can also become porous from absorption of the then film into the porous ILD. Thus sealing of the pores of porous ILD's is required. Barrier layers of silicon carbide (SiC), titanium nitride (TiN), tungsten nitride (WN), and tantalum nitride (TaN) formed by atomic layer deposition (ALD) have been proposed due to the good barrier capability and highly conformal result on the porous ILD. While a k-value as low as about 2.6 has been claimed by porous ILD's, it is difficult to achieve this result reliably with a reliable, stable film.

Generally, porous ILD's suffer from various problems. It is difficult to use porous ILD's with interconnects such as copper, because during surface planarization the porous ILD continues to etch at a high rate once the copper interconnect is exposed, thereby resulting in an uneven surface. Porous ILD's also have poor mechanical strength due to its lower density and porous structure. Moisture absorption of the porous film is also a concern due to the large porous surface area, and it is difficult to reliably seal the porous film with a barrier which will not itself be absorbed into the film. New materials and processes must be developed before porous ILD layers can be successful.

A method for forming a dielectric layer, and a structure resulting from the inventive method, which allows for a multilayer interconnect while reducing or eliminating the problems with prior films as described above would be desirable.

SUMMARY OF THE INVENTION

The present invention provides a new method which, among other advantages, reduces problems associated with the manufacture of semiconductor devices, particularly problems resulting from prior interlayer dielectrics and their formation.

One embodiment of the invention comprises forming a first blanket oxide layer, such as silicon dioxide, then forming a first nitride layer, such as silicon nitride, over the first oxide layer. A plurality of openings are etched in the first nitride layer at predetermined locations, then the first nitride is used as a mask to etch a plurality of voids within the first oxide layer. The openings in the first nitride layer are filled, for example using a blanket deposition of silicon nitride, then a second oxide layer is formed over the first nitride layer. A plurality of metal features such as plugs or conductive interconnects are formed within the second oxide layer, specifically over the voids formed in the first oxide layer. Next, a second nitride layer is formed over the second oxide layer, and a plurality of voids are etched into the second oxide layer between metal features. The process is continued to form a plurality of metallization layers in a predetermined configuration, with voids in oxide which are preferably formed below, between, and above the metal layers functioning as electrical isolation.

The voids in the oxide layers provide electrical isolation while the nitride layers function as etch masks and as a supporting substrate for conductive and dielectric features which are subsequently formed. The voids provide a chemically inert isolation which is stable, which has a low dielectric constant, and which uses easily formed materials having identifiable properties.

Additional advantages will become apparent to those skilled in the art from the following detailed description read in conjunction with the appended claims and the drawings attached hereto.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
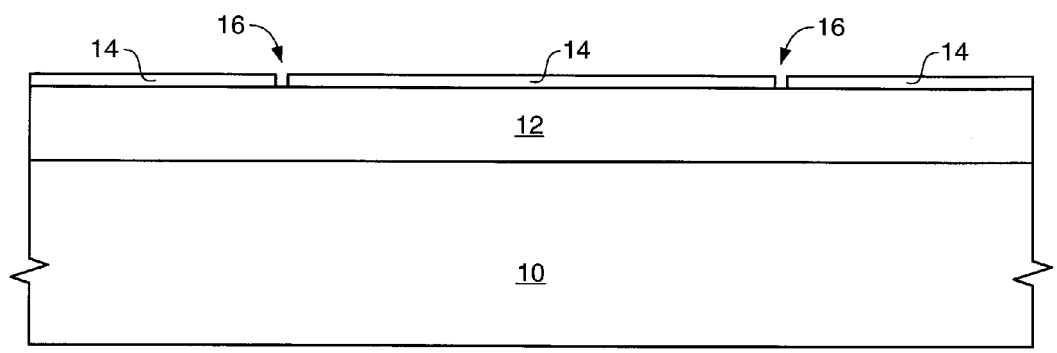
FIGS. 1 and 4–9 are cross sections depicting intermediate in-process structures provided during one embodiment of the invention to form a semiconductor device.

A first embodiment of an inventive method, and various intermediate in-process structures, are depicted in FIGS. 1–7. FIG. 1 depicts a semiconductor wafer 10, a silicon dioxide ($SiO_2$) layer 12 formed on wafer 10, and a patterned silicon nitride ($Si_3N_4$) layer 14 formed on the $SiO_2$ layer. The thickness and spacing of the various layers and features will vary depending on the use of the invention. However, in this exemplary embodiment the $SiO_2$ layer, which can be formed using standard tetraethyl orthosilicate (TEOS), borophosphosilicate glass (BPSG), or spun-on glass (SOG) processes, is between about 8,000 angstroms (Å) and about 12,000 Å thick, for example about 10,000 Å. The $Si_3N_4$ layer may be between about 800 Å and about 1,200 Å, for example about 1,000 Å, and can be formed using chemical vapor deposition (CVD) or plasma-enhanced CVD (PECVD) techniques. Openings 16 in the silicon nitride layer 14 may be formed by providing a patterned photoresist layer (not individually depicted) on the nitride, etching the nitride, for example using reactive ion etching (RIE), then removing the photoresist layer. The openings 16 may be between about 800 Å and 1,200 Å wide, with a spacing of about 20,000 Å.

Figure 2:
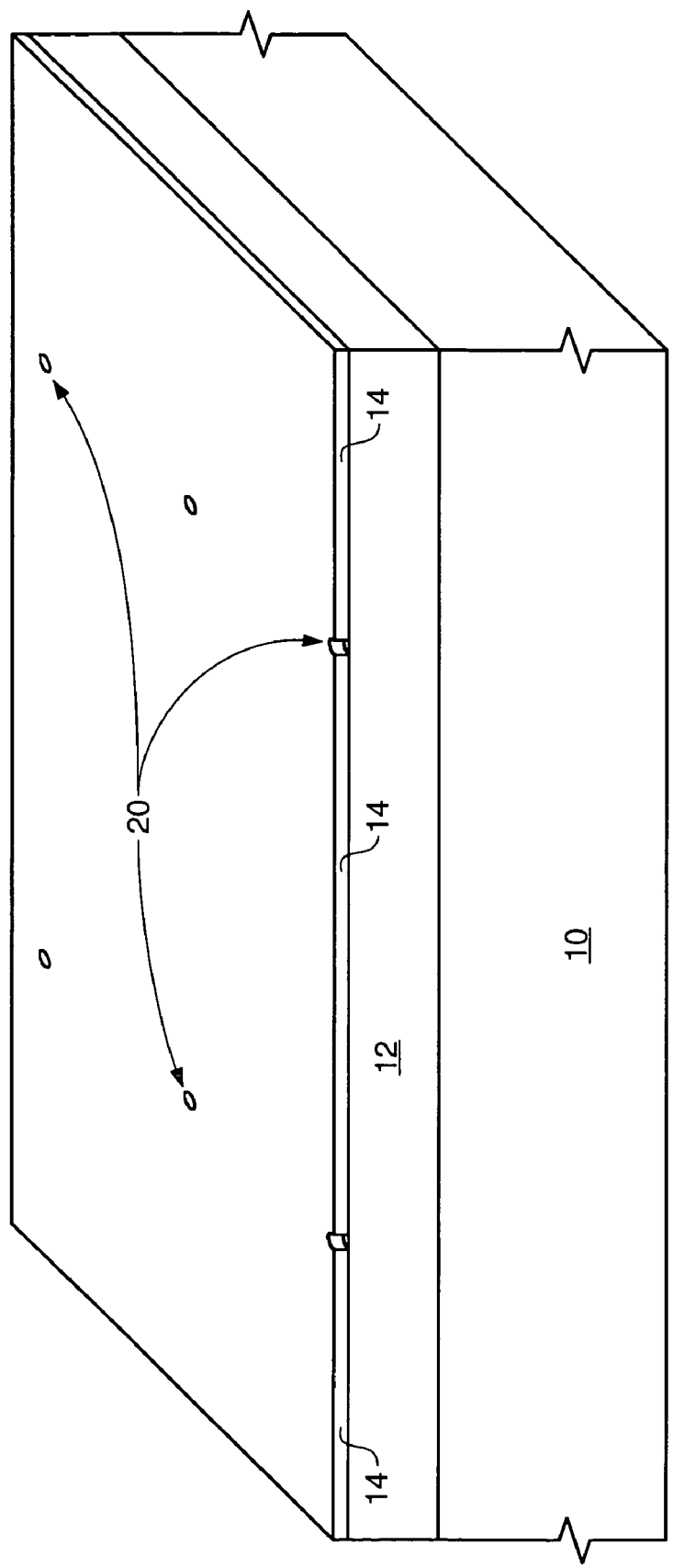
FIGS. 2 and 3 are isometric FIGS. of two different embodiments of the invention.
Figure 3:
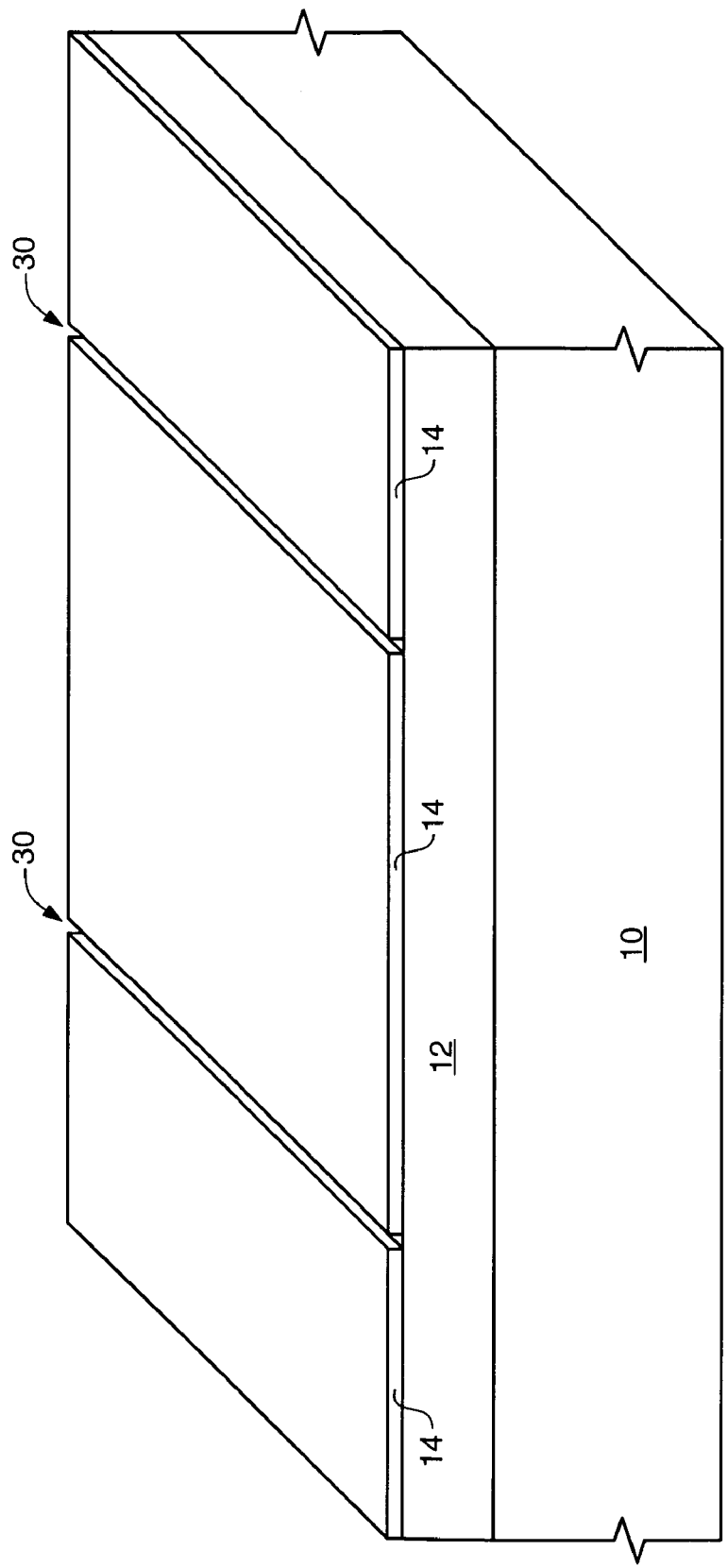

The shape of the openings 16 in nitride 14 will vary depending on the eventual use of the invention. In this exemplary embodiment, openings 20 of FIG. 2 are used, although the openings may also be as depicted in FIG. 3 with opening 30, or other shapes such as square, rectangular, or oval may be provided depending on the eventual use. Opening 20 may be particularly useful for forming conductive plugs, while opening 30 may be used with conductive interconnects. Openings 20, depending on their spacing, will result in hemispherically-shaped microcavities in layer 12. If openings 30 are close to each other, resulting microcavities will be continuous in the direction of the opening 30 and will have a scalloped, semicircular appearance in a cross section perpendicular to the openings 30.

For purposes of this disclosure, a microcavity is an etched space formed in a dielectric layer which is not filled with a solid, but will comprise a gas. When etched with the circular or oval opening in the mask as described herein, the microcavity will be a hemispherical or elongated hemispherical void having a cross sectional radius. Square or rectangular mask openings may also be used, which would result in a microcavity having other shapes.

Figure 4:
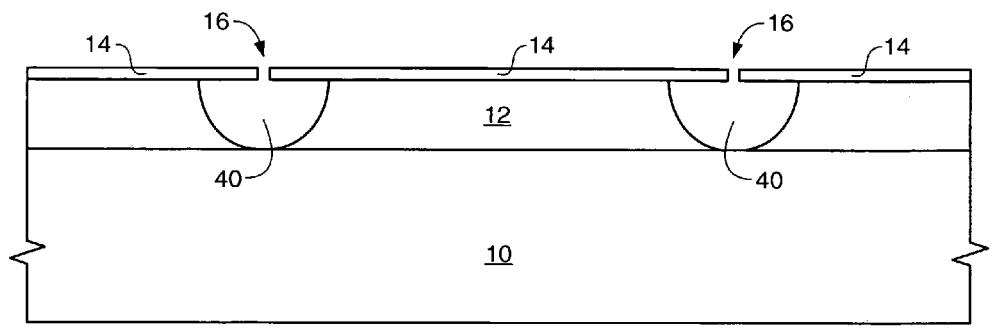
Figure 5:
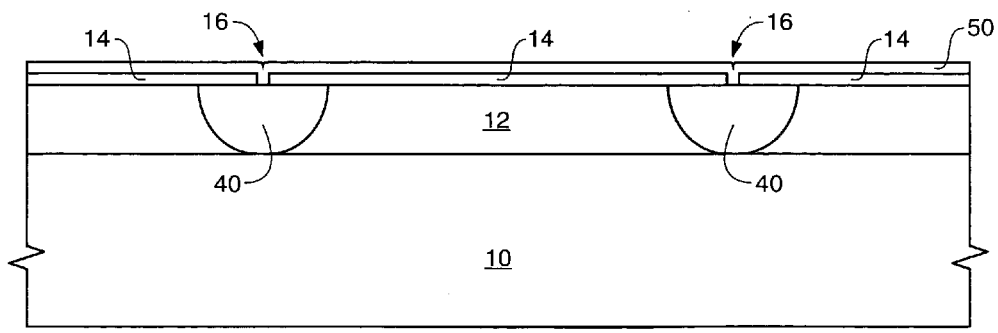

After forming the structure of FIGS. 1 and 2, $SiO_2$ layer 12 is etched using the $Si_3N_4$ layer as a pattern to result in the structure of FIG. 4 having microcavities 40 formed in the $SiO_2$ layer 12. In this embodiment the microcavities comprise a hemispherical shape. The $SiO_2$ can be etched selective to the $Si_3N_4$ using a solution comprising hydrofluoric acid (HF). To minimize the dielectric constant the etch is performed until the substrate 10 (or another layer underlying $SiO_2$ 12) is exposed. This forms a microcavity between about 8,000 Å and about 12,000 Å deep (i.e. the thickness of the $SiO_2$ layer 12) and about 16,000 Å to about 20,000 Å wide at the top of layer 12.

Subsequently, the openings 16 in nitride 14 are filled, for example by forming a conformal second nitride layer on the first nitride layer 14. To fill openings 16, the second nitride layer is typically formed to be at least half the width of the opening. Thus with openings 16 between 800 Å and 1,200 Å wide, the second nitride layer 50 must be at least about 400 Å to about 600 Å thick, or thicker. Any deposition of nitride on silicon dioxide layer 12 on the surface of microcavity 40 will be negligible and will not contribute any significant negative effects. After filling openings 16, the structure of FIG. 5 remains.

Figure 6:
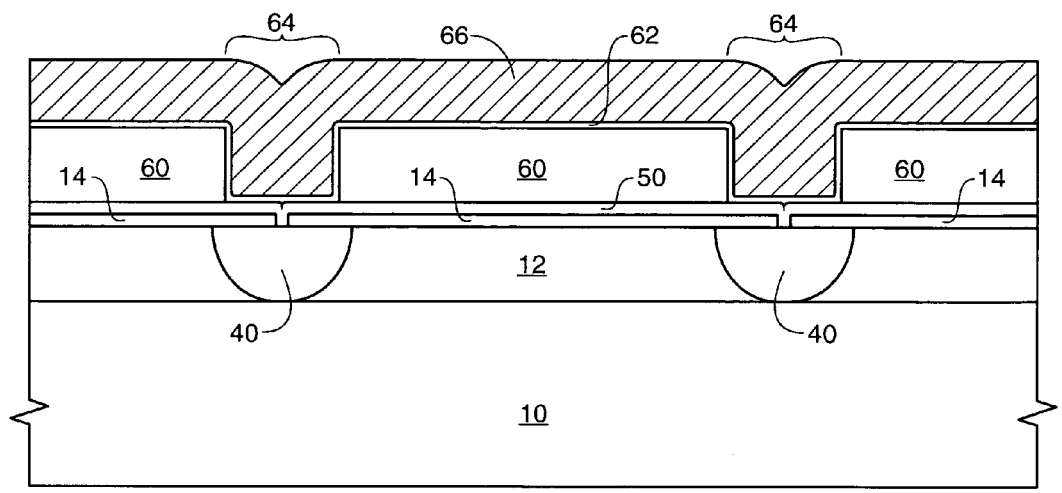

Next, another silicon dioxide layer 60 is formed on the second nitride layer 50 as depicted in FIG. 6. The $SiO_2$ layer 60 is masked with photoresist and etched, for example using RIE, to form an opening or trench 64 therein having a width which will depend on the requirement of the feature to be formed. A barrier layer 62, for example a silicon nitride layer or conductive barriers of tungsten nitride, titanium nitride, tantalum nitride, etc. between about 800 Å and 1,200 Å is formed over silicon dioxide 60, then a blanket metal layer 66 such as copper or aluminum is formed within the trench. The barrier material, if optionally used, prevents diffusion of the conductor 66 into the silicon dioxide and may function as an adhesion layer between conductor 66 and $SiO_2$. After forming metal layer 66, the structure of FIG. 6 remains.

Subsequently, the metal layer 66 and the $Si_3N_4$ layer 62 are planarized down to the level of the silicon dioxide layer 60. These layers can be planarized using mechanical planarization or chemical mechanical planarization (CMP) to result in a damascene feature. In contract to porous silicon dioxide and copper, the bulk silicon dioxide and copper metallization can be compatibly polished using CMP. After planarization, a patterned $Si_3N_4$ layer 70 is formed over the polished surface to result in the FIG. 7 structure. Layer 70 can be formed in a similar process to the formation of layer 14 of FIG. 1, and may have similar dimensions and spacing.

Figure 7:
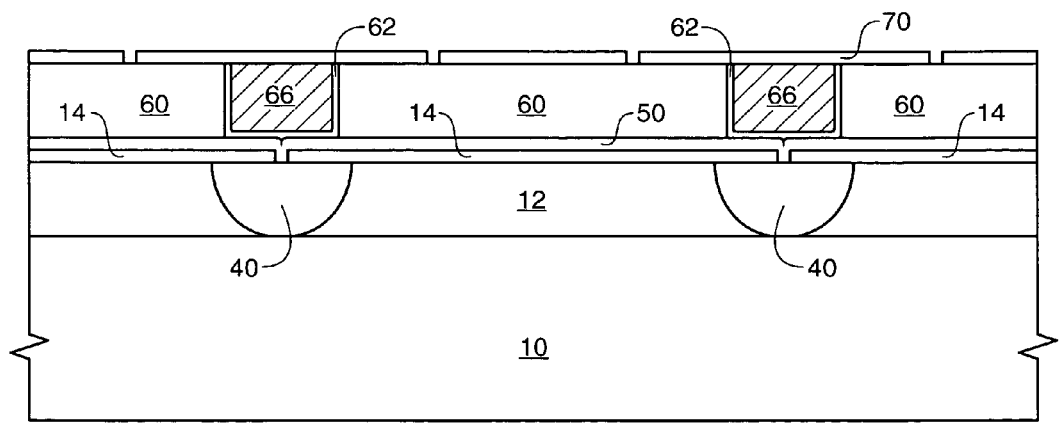
Figure 8:
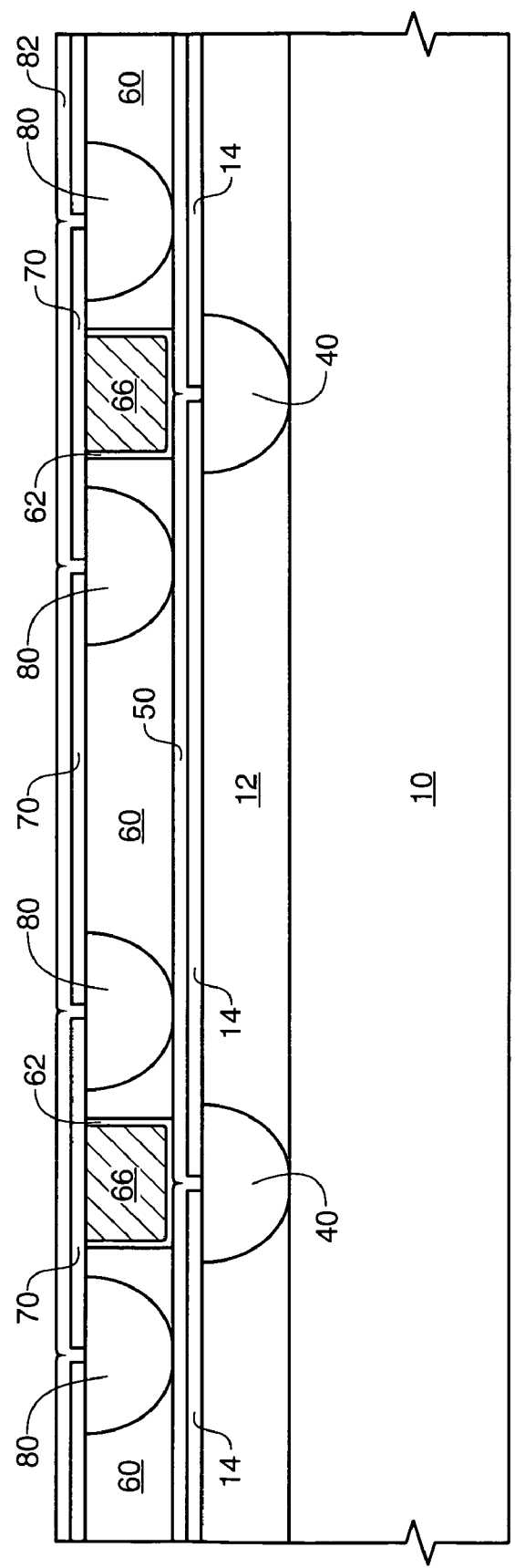

After forming the FIG. 7 structure the $SiO_2$ layer 60 is isotropically etched, for example using hydrofluoric acid to form microcavities 80 of FIG. 8, which also depicts layer 82, for example a thin $Si_3N_4$ layer which fills the openings in layer 70.

Figure 9:
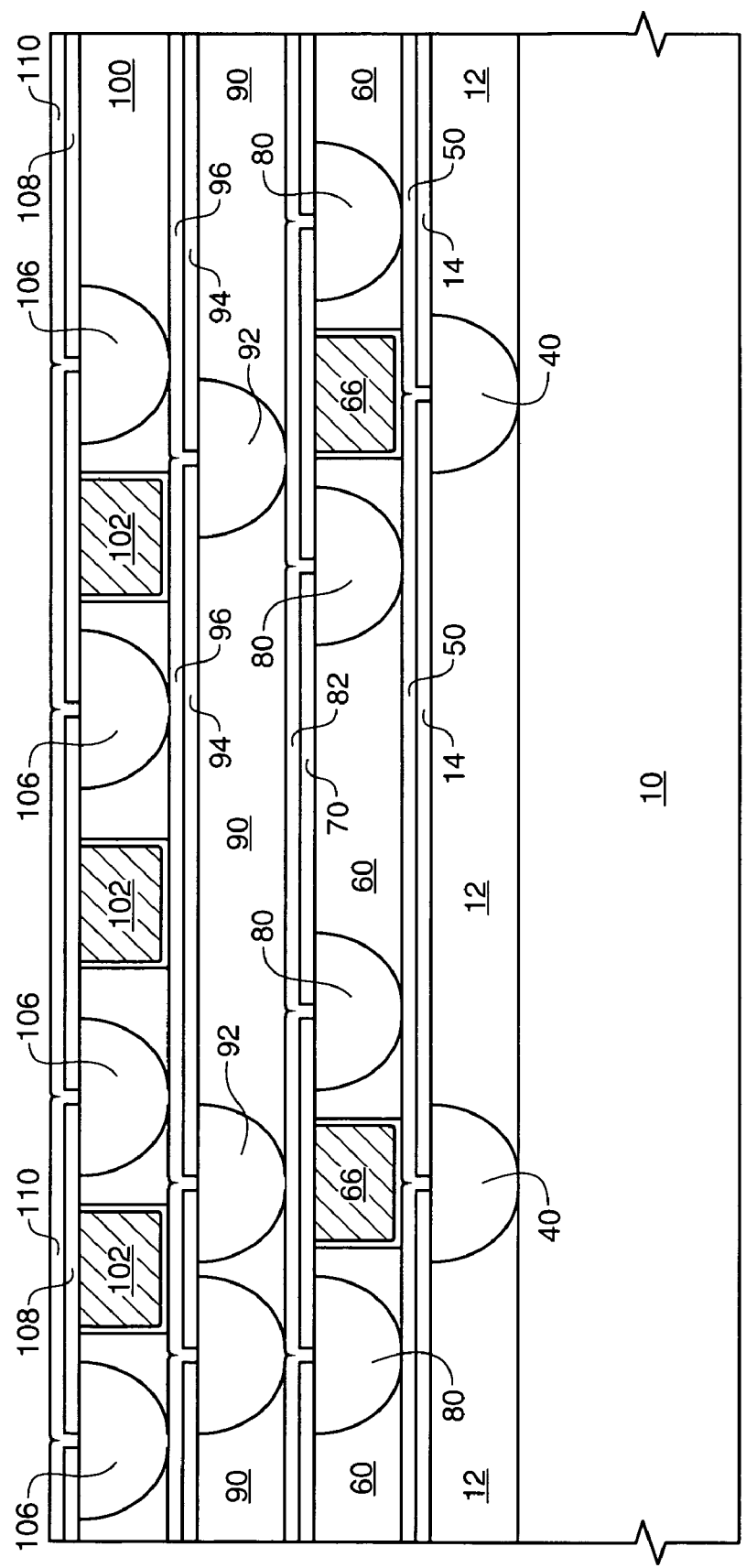

This process of $Si_3N_4$ and $SiO_2$ layering along with metallization can continue to form a desired structure. For example, FIG. 9 depicts the FIG. 8 structure with another layer of silicon dioxide 90 having microcavities 92 formed therein, and first 94 and second 96 $Si_3N_4$ layers formed over layer 90. Silicon dioxide layer 100 comprises metallization 102, another $Si_3N_4$ liner 104, microcavities 106, a $Si_3N_4$ masking layer 108, and a thin $Si_3N_4$ layer which fills openings in layer 108 which were used to etch microcavities 106. Microcavities 92 electrically separate metal 66 from metal 102, and microcavities 106 separate metal 102 within layer 100 from each other. FIG. 9 depicts a conductor 66, left side, surrounded on four sides by a void in the three silicon dioxide layers 12, 60, 90. Further, the two conductors 66 within silicon dioxide layer 60 which have no intervening conductive layer are separated from each other by two different microcavities. Conductors 66 and 102 are separated vertically from each other by one or more intervening microcavities 92. Microcavity 40 has a width as does conductor 66, and the width of the microcavity in this embodiment is at least as wide or wider than the width of the conductor. The conductor 66 is approximately vertically centered over the microcavity 40 to maximize the insulating value of the microcavity.

Figure 10:
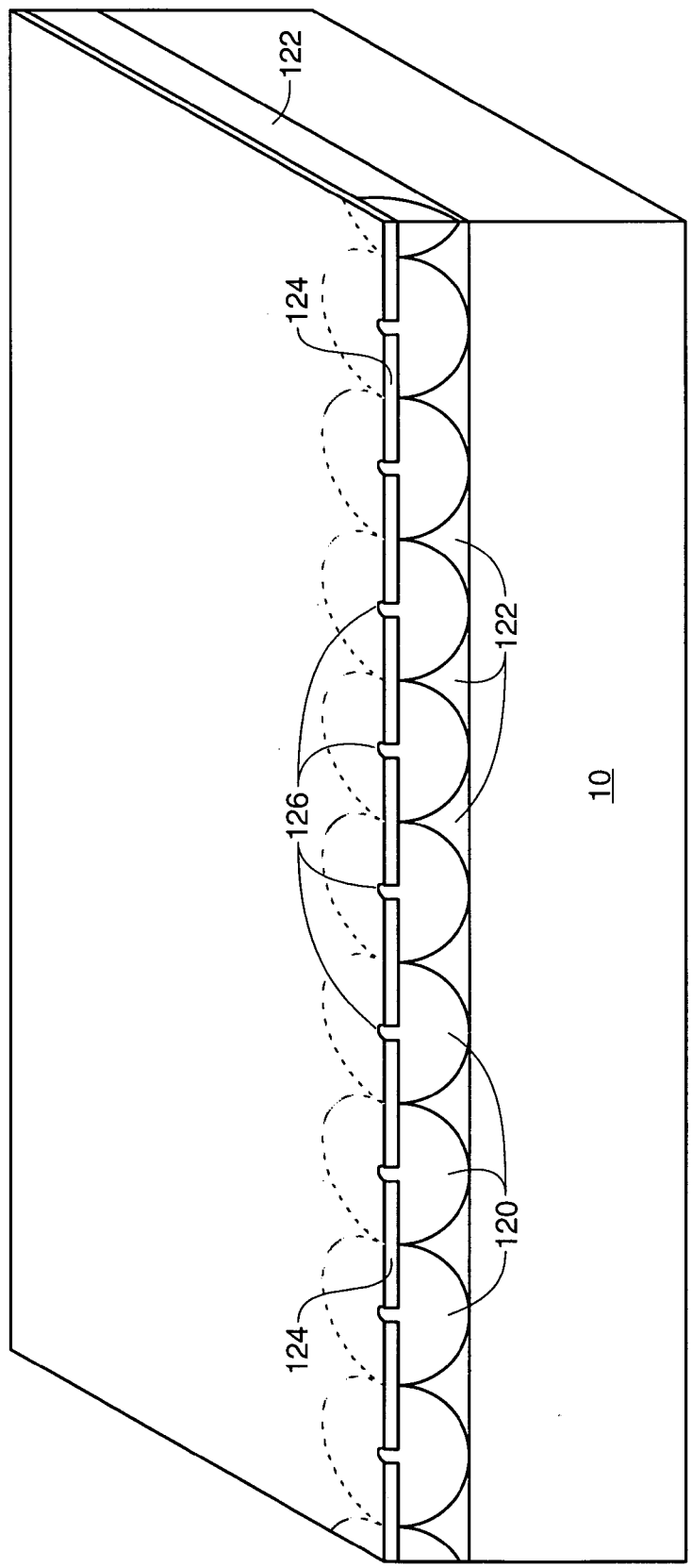
FIG. 10 is an isometric depiction of another embodiment of the invention which provides support and has a low dielectric constant.

FIG. 10 depicts a plurality of microcavities 120 for a structure which provides a low-k $SiO_2$ dielectric layer 122 while affording vertical support of the $Si_3N_4$ layer 124 and any features formed on layer 124. In other instances the material between the cavities can be hollowed out completely to provide a continuous void, but the support of the silicon nitride layer 124 may be compromised if excessive material is removed.

Figure 11:
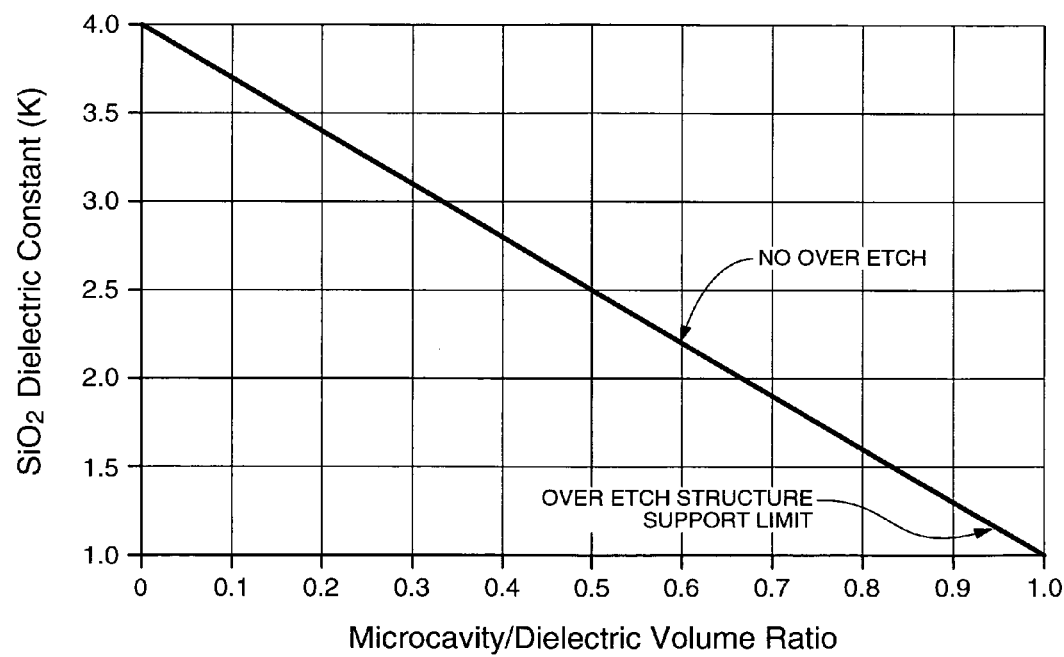
FIG. 11 is a graph depicting a range of microcavity volumes plotted with dielectric constants.

FIG. 11 depicts the value of the dielectric constant as a function of the ratio of the microcavity volume to the total dielectric volume. Generally, the microcavities within the silicon dioxide will have a higher resistance than the silicon dioxide itself. The dielectric constant of the silicon dioxide will decrease as the microcavity to silicon dioxide increases. However, sufficient material must remain to prevent collapse of the overlying silicon nitride layer. Over etch begins to occur as the microcavity/dielectric volume ratio reaches about 0.6 (dielectric constant about 2.2), and the silicon nitride mask begins to collapse as the microcavity/dielectric volume ratio reaches about 0.97 (dielectric constant about 1.15).

To form a layer having a desired dielectric constant, the dielectric constant to be provided as a property of a dielectric layer, such as a $SiO_2$ layer, is first determined. The $SiO_2$ layer is then formed, and a patterned mask layer, for example a first $Si_3N_4$ layer, is formed on the $SiO_2$ layer. The patterned mask comprises a number of openings therein, with the density of the openings (i.e. the number of openings per unit area) being determined by the dielectric constant to be provided as a property of the $SiO_2$ layer. A plurality of microcavities is etched within the $SiO_2$ layer using the mask as a pattern. A third layer, for example another $Si_3N_4$ layer, is formed over the mask to fill the openings in the mask but leaving the microcavities in the $SiO_2$ layer. Thus the dielectric constant of the $SiO_2$ layer is inversely proportional to the number of openings in the mask layer, which is used to etch the microcavities in the $SiO_2$ layer. That is, as the number of microcavities of a given size within the $SiO_2$ layer increases the dielectric constant of the $SiO_2$ layer decreases. However, as stated in the previous paragraph with regard to FIG. 11, sufficient material must remain such that the structure does not collapse.

The present invention reduces or eliminates various drawbacks of prior conventional low-k dielectric materials and processes by using relatively simple and inexpensive methods and apparatuses, and provides a material with which a dielectric constant of less than 2.6 may be achieved. The materials ($SiO_2$, $Si_3N_4$, TiN, TaN, etc.) and the processes (CVD, lithography, wet etch, RIE, CMP, etc.) are compatible with current semiconductor technology, and are well understood and well established. Typically, only a few percent of the ILD's in multilevel interconnections require low dielectric constants for a smaller RC delay, thus selective patterning of the low-k dielectric can satisfy very low-k requirements at necessary sites while maintaining good mechanical and chemical properties of bulk $SiO_2$ film globally. The low-k ILD can be selectively patterned such that the crosstalk requirements and RC delay can be satisfied without sacrificing mechanical strength, chemical and thermal stability, and reliability of the conventional ILD. The trade-off of low-k, integrity, and reliability can be controlled by adjusting the microcavity density, size, and location.

Selective patterning of the low-k dielectric can improve moisture and chemical sealing concerns, and results in a barrier process which is not porous and therefore does not have the problems found with porous silicon dioxide barriers. Silicon nitride is a desirable barrier layer because it provides good protection from copper diffusing into the silicon dioxide, and offers superior compatibility with silicon dioxide and silicon, as well as with copper. However, when used to seal a porous layer such as a porous silicon dioxide layer, the high permittivity of $Si_3N_4$ (6<k<8) limits its ability to reduce the RC delay of an interconnect formed within the porous dielectric. This results because a thicker $Si_3N_4$ layer is required to seal a porous dielectric surface. Further, this thicker layer opens other barrier integration difficulties in damascene processes. For the nonporous interface of the bulk $SiO_2$ layer of the invention, only a thin $Si_3N_4$ layer is needed as the barrier layer so the negative effects of the relatively high-k of the $Si_3N_4$ on the RC delay is negligible.

As discussed above, the low-k $SiO_2$ bulk film with microcavities of the present invention can be selectively formed by using conventional lithography, RIE, an isotropic wet etch, and conformal CVD processes to result in a dielectric having a dielectric constant as low as 1.1. The tradeoffs of using the low-k dielectric of the present invention, layer integrity, is controllable by controlling the size, density, and location of the microcavity. The present process is more controllable than conventional processes because the CMP step will be implemented on the surface of copper and bulk $SiO_2$ dielectric, rather than on copper and porous oxide.

Figure 12:
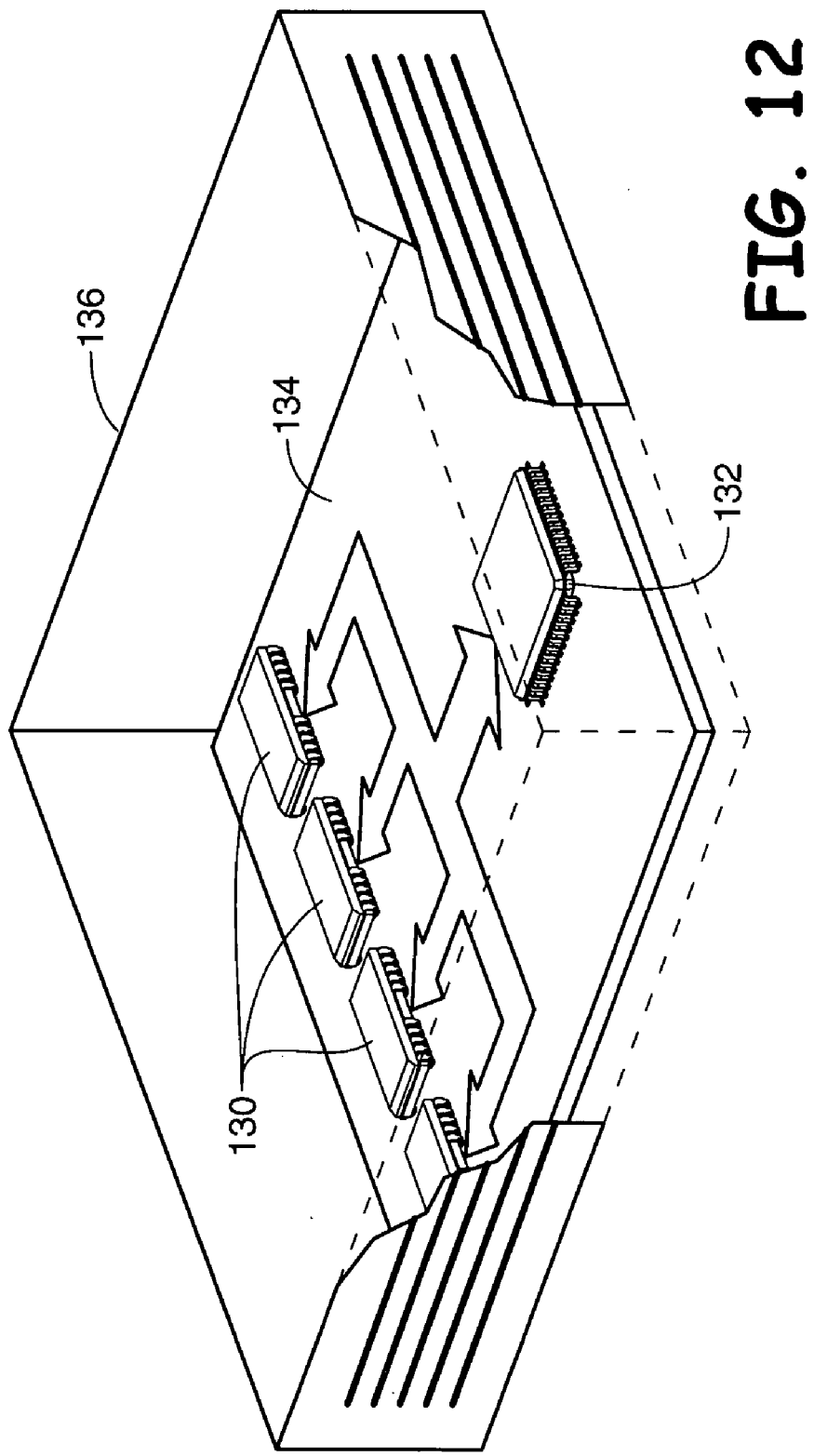
FIG. 12 is an isometric depiction of various components which may be manufactured using devices formed with an embodiment of the present invention.

This low-k dielectric process may be used for any semiconductor devices including microprocessors, dynamic random access memories (DRAMs), static random access memories (SRAMs), application-specific integrated circuits (ASICs), logic devices, etc. One exemplary embodiment is depicted in FIG. 12, which depicts a semiconductor device 130 formed in accordance with the invention attached along with other devices such as a microprocessor 132 to a printed circuit board 134, for example to a computer motherboard or as a part of a memory module used in a personal computer, a minicomputer, or a mainframe 136. FIG. 12 may also represent use of device 130 in other electronic devices comprising a housing 136, for example devices comprising a microprocessor 132, related to telecommunications, the automobile industry, semiconductor test and manufacturing equipment, consumer electronics, or virtually any piece of consumer or industrial electronic equipment.

Figure 13:
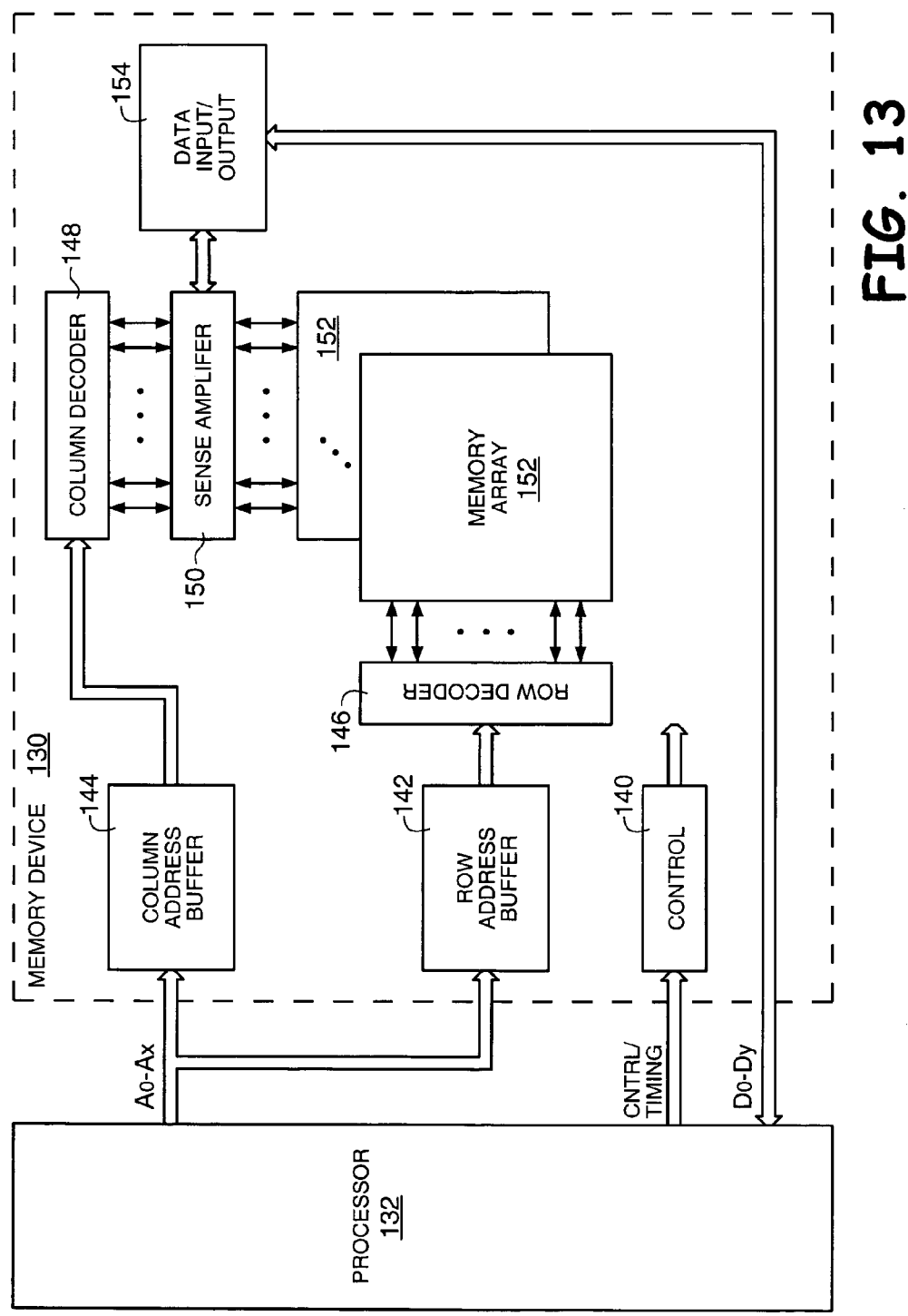
FIG. 13 is a block diagram of an exemplary use of the invention to form part of a memory device having a storage transistor array It should be emphasized that the drawings herein may not be to exact scale and are schematic representations. The drawings are not intended to portray the specific parameters, materials, particular uses, or the structural details of the invention, which can be determined by one of skill in the art by examination of the information herein.

The process and structure described herein can be used to manufacture a number of different structures which comprise a structure formed using a photolithographic process. FIG. 13, for example, is a simplified block diagram of a memory device such as a dynamic random access memory having digit lines and other features which may be formed using an embodiment of the present invention. The general operation of such a device is known to one skilled in the art. FIG. 13 depicts a processor 132 coupled to a memory device 130, and further depicts the following basic sections of a memory integrated circuit: control circuitry 140; row 142 and column 144 address buffers; row 146 and column 148 decoders; sense amplifiers 150; memory array 152; and data input/output 154.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, while one described embodiment discusses the formation of a damascene feature, the invention may be used during the formation of other conductive features such as dual damascene or etched structures. That is, this method works for both the damascene or dual-damascene copper low-k and conventional aluminum low-k processes. It is therefore contemplated that the appended claims will cover any such modifications or embodiments as fall within the true scope of the invention.

The invention claimed is:

1. A method used to form a semiconductor device, comprising:
   forming a first conductive feature at a first location and a second conductive feature at a second location;
   forming a first dielectric layer;
   forming a second dielectric layer having an opening therein over the first dielectric layer;
   etching a microcavity within the first dielectric layer using the second dielectric layer as a masking layer; and
   forming a third dielectric layer over the second dielectric layer to fill the opening in the second dielectric layer, wherein subsequent to filling the opening in the second dielectric layer the microcavity in the first dielectric layer remains, and the microcavity is interposed between the first and second locations.

2. The method of claim 1 further comprising forming at least one of the first and second conductive features prior to forming the microcavity.

3. The method of claim 1 wherein the microcavity is a first microcavity and the method further comprises forming a second microcavity simultaneously during the formation of the first microcavity, wherein the second microcavity is interposed between the first and second locations.

4. The method of claim 3 wherein the first and second locations have no intervening locations where conductive features will exist.

5. The method of claim 1 further comprising:
   forming a fourth dielectric layer over the third dielectric layer and over the microcavity; and
   forming a conductive feature within the fourth dielectric layer, wherein the conductive feature is located directly over the microcavity.

6. The method of claim 1 further comprising etching the microcavity to have a cross sectional, hemispherical shape with a radius of between about 8,000 Å and about 12,000 Å.

7. A method for forming a semiconductor device comprising:
   forming a first silicon dioxide layer over a semiconductor wafer;
   forming a first silicon nitride layer over the silicon dioxide layer, wherein the first silicon nitride layer comprises an opening therein;
   etching the first silicon dioxide layer using the first silicon nitride layer having the opening therein as a mask, wherein the etching forms a microcavity in the silicon dioxide layer;
   subsequent to etching the silicon dioxide layer, forming a second silicon nitride layer over the first silicon nitride layer which fills the opening in the first silicon nitride layer and leaves the microcavity within the silicon dioxide layer, wherein the first and second silicon nitride layers have no intervening layers therebetween;
   forming a second silicon dioxide layer on the second silicon nitride layer;
   etching an opening in the second silicon dioxide layer, wherein the opening is directly over the microcavity; and
   forming a conductive feature in the opening in the second silicon dioxide layer.

8. The method of claim 7 further comprising:
   forming the first silicon dioxide layer to be between about 8,000 Å and about 12,000 Å thick;
   forming the first silicon nitride layer to be between about 800 Å and about 1,200 Å thick; and
   forming the second silicon nitride layer to be at least about 400 Å thick.

9. The method of claim 7 wherein the conductive feature has a first width, the microcavity has a second width at least as wide or wider than the first width, and the conductive feature is approximately vertically centered over the microcavity.

10. The method of claim 7 further comprising:
forming the first silicon nitride layer to have a plurality of openings therein; and
forming a plurality of microcavities in the first silicon dioxide layer during the etching of the first silicon dioxide layer, wherein the plurality of microcavities forms a scalloped cross section in a direction perpendicular with the openings in the first silicon nitride layer and comprises a continuous opening in a cross section parallel with the openings in the first silicon nitride layer.

11. The method of claim 7 further comprising:
forming the first silicon nitride layer to have a plurality of circular or oval openings therein; and
forming a plurality of microcavities in the first silicon dioxide layer during the etching of the first silicon dioxide layer, wherein the plurality of microcavities forms a scalloped cross section in directions both perpendicular and parallel with the openings in the first silicon nitride layer.

12. A method for forming a semiconductor device, comprising:
forming a first dielectric layer over a semiconductor wafer;
forming a second dielectric layer over the first dielectric layer, wherein the second dielectric layer comprises at least two spaced openings therein;
etching the first dielectric layer using the second dielectric layer as a mask to form at least two spaced microcavities in the first dielectric layer;
subsequent to etching the first dielectric layer, forming a third dielectric layer to fill the openings in the second dielectric layer;
forming a fourth dielectric layer over the third dielectric layer;
forming at least two spaced conductive features within the fourth dielectric layer, wherein each of the two spaced conductive features directly overlies one of the two spaced openings in the second dielectric layer;
forming a fifth dielectric layer over the fourth dielectric layer, wherein the fifth dielectric layer comprises at least three spaced openings therein;
etching the fourth dielectric layer using the fifth dielectric layer as a mask to form at least three spaced microcavities in the fourth dielectric layer, with one spaced microcavity located on either side of each of the two spaced conductive features; and
subsequent to etching the fourth dielectric layer, forming a sixth dielectric layer to fill the openings in the fifth dielectric layer.

13. The method of claim 12 further comprising:
forming the first and fourth dielectric layers from silicon dioxide; and
forming the second, third, fifth, and sixth dielectric layers from silicon nitride.

14. The method of claim 12 further comprising:
etching first and second openings in the fourth dielectric layer;
forming a blanket conductive layer over the fourth dielectric layer and within the first and second openings in the fourth dielectric layer;
polishing the blanket conductive layer to remove the blanket conductive layer from over the fourth dielectric layer, to leave the conductive layer in the openings in the fourth dielectric layer, and to form the two spaced conductive features.

15. A method used to form a semiconductor device, comprising:
determining a dielectric constant to be provided as a property of a first dielectric layer;
forming a first dielectric layer;
forming a second dielectric layer over the first dielectric layer, wherein the second dielectric layer comprises a number of openings therein, and a density of the openings in the second dielectric layer is determined by the dielectric constant to be provided as a property of the first dielectric layer;
etching a plurality of microcavities within the first dielectric layer using the second dielectric layer as a masking layer; and
forming a third dielectric layer over the second dielectric layer to fill the openings in the second dielectric layer,
wherein subsequent to filling the plurality of openings in the second dielectric layer the microcavity in the first dielectric layer remains, and the dielectric constant of the etched first dielectric layer is inversely proportional to the number of openings in the second dielectric layer.

16. A method used in fabrication of an electronic system, comprising:
fabricating at least one semiconductor device using a method comprising:
determining a dielectric constant to be provided as a property of a first dielectric layer;
forming a first dielectric layer;
forming a second dielectric layer over the first dielectric layer, wherein the second dielectric layer comprises a number of openings therein, and a density of the openings in the second dielectric layer is determined by the dielectric constant to be provided as a property of the first dielectric layer;
etching a plurality of microcavities within the first dielectric layer using the second dielectric layer as a masking layer; and
forming a third dielectric layer over the second dielectric layer to fill the openings in the second dielectric layer,
wherein subsequent to filling the plurality of openings in the second dielectric layer the microcavity in the first dielectric layer remains, and the dielectric constant of the etched first dielectric layer is inversely proportional to the number of openings in the second dielectric layer;
providing at least one microprocessor; and
providing an electrical pathway between the at least one semiconductor device and the at least one microprocessor to facilitate electrical communication therebetween.

17. The method of claim 16 further comprising etching each of the microcavities to have a cross sectional, hemispherical shape.

18. The method of claim 17 further comprising etching each of the microcavities to have a radius of between about 8,000 Å and about 12,000 Å.

19. The method of claim 16 wherein the fabrication of the at least one semiconductor device further comprises forming a first conductive feature and a second conductive feature, wherein the second conductive feature is laterally spaced from the first conductive feature, and at least first and second laterally spaced microcavities are interposed between the first and second conductive features with no conductive feature interposed between the first and second laterally spaced microcavities.

20. A method used to form a semiconductor device, comprising:

forming a first dielectric layer;

forming a second dielectric layer having an opening therein over the first dielectric layer;

etching a microcavity within the first dielectric layer using the second dielectric layer as a masking layer, wherein the microcavity has a cross sectional, hemispherical shape; and forming a third dielectric layer over the second dielectric layer to fill the opening in the second dielectric layer, wherein subsequent to filling the opening in the second dielectric layer the microcavity in the first dielectric layer remains.

21. The method of claim 20 further comprising forming the microcavity to have a radius of between about 8,000 Å and about 12,000 Å.

22. A method for forming a semiconductor device comprising:

forming a silicon dioxide layer over a semiconductor wafer;

forming a first silicon nitride layer over the silicon dioxide layer, wherein the first silicon nitride layer comprises a plurality of circular or oval openings therein;

etching the silicon dioxide layer using the first silicon nitride layer having the opening therein as a mask, wherein the etching forms a plurality of microcavities in the silicon dioxide layer, wherein the plurality of microcavities forms a scalloped cross section in directions both perpendicular and parallel with the openings in the first silicon nitride layer; and subsequent to etching the silicon dioxide layer, forming a second silicon nitride layer over the first silicon nitride layer which fills the opening in the first silicon nitride layer and leaves the microcavity within the silicon dioxide layer, wherein the first and second silicon nitride layers have no intervening layers therebetween.

* * * * *

UNITED STATES PATENT AND TRADEMARK OFFICE
CERTIFICATE OF CORRECTION

PATENT NO. : 7,235,493 B2 Page 1 of 1
APPLICATION NO. : 10/968786
DATED : June 26, 2007
INVENTOR(S) : Qin It is certified that error appears in the above-identified patent and that said Letters Patent is hereby corrected as shown below:

On the Title Page, Item (54), in column 1, line 3, delete "MIRCOCAVITY" and insert -- MICROCAVITY --, therefor.

In column 1, line 3, delete "MIRCOCAVITY" and insert -- MICROCAVITY --, therefor.

Signed and Sealed this

Eleventh Day of December, 2007

JON W. DUDAS
*Director of the United States Patent and Trademark Office*